(12) United States Patent
Vincent et al.

(10) Patent No.: US 9,761,565 B2
(45) Date of Patent: Sep. 12, 2017

(54) MICROELECTRONIC PACKAGES HAVING EMBEDDED SIDEWALL SUBSTRATES AND METHODS FOR THE PRODUCING THEREOF

(71) Applicant: NXP USA, INC., Austin, TX (US)

(72) Inventors: Michael B. Vincent, Phoenix, AZ (US); Scott M. Hayes, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/418,845

(22) Filed: Jan. 30, 2017

(65) Prior Publication Data

US 2017/0141084 A1    May 18, 2017

Related U.S. Application Data

(62) Division of application No. 14/316,580, filed on Jun. 26, 2014, now Pat. No. 9,595,485.

(51) Int. Cl.
*H01L 25/065* (2006.01)
*H01L 23/528* (2006.01)
(Continued)

(52) U.S. Cl.
CPC .......... *H01L 25/0657* (2013.01); *H01L 21/78* (2013.01); *H01L 23/3114* (2013.01); *H01L 23/528* (2013.01); *H01L 24/09* (2013.01); *H01L 24/94* (2013.01); *H01L 2224/0231* (2013.01); *H01L 2224/0237* (2013.01); *H01L 2225/06541* (2013.01); *H01L 2225/06548* (2013.01); *H01L 2225/06551* (2013.01)

(58) Field of Classification Search
CPC ... H01L 23/3114; H01L 25/105; H01L 24/97; H01L 24/19; H01L 24/96; H01L 21/561; H01L 23/5389; H01L 25/50; H01L 21/78; H01L 2225/1035; H01L 2224/12105; H01L 2225/1064; H01L 2224/04105; H01L 23/49816; H01L 21/568
See application file for complete search history.

(56) References Cited

U.S. PATENT DOCUMENTS 5,019,946 A    5/1991    Eichelberger et al.
9,263,420 B2    2/2016    Vincent et al.
(Continued)

OTHER PUBLICATIONS

Fjelstad, "Materials and Methods for IC Package Assembies", Aug. 2005, Solid State Technolgy Insights for Electronics Manufacturing, pp. 1-8.*

(Continued)

*Primary Examiner* — Cuong B Nguyen
*Assistant Examiner* — Juanita Rhodes (57) ABSTRACT

Methods for fabricating microelectronic packages and microelectronic packages are provided. In one embodiment, the microelectronic package fabrication method includes producing a molded panel containing a sidewall substrate. The molded panel is singulated to produce a Fan-Out Wafer Level Package core including a molded body having a fan-out region in which the sidewall substrate is embedded. A side connect trace is printed or otherwise formed on a sidewall of the Fan-Out Wafer Level Package core and extends at least partially across the embedded sidewall substrate.

19 Claims, 4 Drawing Sheets

(51) Int. Cl.
*H01L 23/31* (2006.01)
*H01L 23/00* (2006.01)
*H01L 21/78* (2006.01)

(56) References Cited

U.S. PATENT DOCUMENTS

| | | |
|---|---|---|
| 2008/0157332 A1 | 7/2008 | Jo et al. |
| 2009/0230533 A1* | 9/2009 | Hoshino ............... H01L 21/561 |
| | | 257/686 |
| 2013/0155639 A1* | 6/2013 | Ogawa .................. H01L 23/552 |
| | | 361/816 |

OTHER PUBLICATIONS

Fjelstad, "Materials and Methods for 1C Package Assembles", Aug. 2005, Solid State Technolgy Insights for Electronics Manufacturing, pp. 1-8.*

* cited by examiner

MICROELECTRONIC PACKAGES HAVING EMBEDDED SIDEWALL SUBSTRATES AND METHODS FOR THE PRODUCING THEREOF

CROSS-REFERENCE TO RELATED APPLICATION

This application is a divisional of U.S. application Ser. No. 14/316,580, filed with the United States Patent and Trademark Office on Jun. 26, 2014.

TECHNICAL FIELD

Embodiments of the present invention relate generally to microelectronic packaging and, more particularly, to microelectronic packages and methods for producing microelectronic packages having embedded sidewall substrates over which side connect traces can be reliably formed.

TECHNICAL FIELD

Embodiments of the present invention relate generally to microelectronic packaging and, more particularly, to microelectronic packages and methods for producing microelectronic packages having embedded sidewall substrates over which side connect traces can be reliably formed.

BACKGROUND

A Fan-Out Wafer Level Package (FO-WLP) commonly includes a molded body in which at least one semiconductor die is embedded. Multiple FO-WLPs can be bonded and interconnected in a stacked relationship to produce a so-called "three dimensional microelectronic package" or, more simply, a "3D package." Each FO-WLP of a set of stacked FO-WLPs of a 3D package may be referred to herein as a "FO-WLP core" to avoid confusion in terminology between the FO-WLPs and the 3D package itself. In the case of many 3D packages, interconnection between the stacked FO-WLP cores is accomplished utilizing one or more Ball Grid Arrays (BGAs), Through Substrate Vias (TSVs), backside Redistribution Layers (RDLs), and the like. The inclusion of such features in a 3D package can, however, add undesired cost and complexity to the manufacturing process. Additionally, the presence of an intervening BGA between stacked FO-WLP cores increases the overall height or thickness of the 3D package. For these and other reasons, 3D packages have been developed that utilize electrically-conductive traces deposited on the package sidewalls to interconnect stacked FO-WLP cores. For example, the electrically-conductive traces (referred to herein as "side connect traces") can electrically couple interconnect lines contained within different stacked FO-WLP cores and extending to one or more sidewalls of the 3D package. Advantageously, such electrically-conductive traces can be produced in a cost effective manner and without increasing overall package thickness.

While providing the above-noted advantages, 3D packages including side connect traces remain limited in certain respects. For example, and without implicit admission that any such problems or drawbacks have been recognized by others in the art, the present inventors have determined that discontinuities or other structural defects can occur within the side connect traces when deposited over the sidewalls of a molded body included within a FO-WLP core. In particular, the side connect traces can be interrupted by cavities or pockets formed in the sidewalls of the molded FO-WLP body due to the dislodgement of hard particles during singulation of the larger molded panel from which the molded body is produced. Such structural defects can increase electrical resistance across the side connect traces or, perhaps, fully sever the electrically-conductive paths provided by the traces. As a further drawback associated with conventional 3D packages, the surface area of the interconnect lines exposed at the package sidewalls and contacted by the side connect traces is often relatively limited due to design restrains placed on interconnect line size. The electrical resistances across the interconnect line-side connect trace interfaces may consequently be undesirably high, while the mechanical strength of these interfaces may be undesirably limited.

BRIEF DESCRIPTION OF THE DRAWINGS

At least one example of the present invention will hereinafter be described in conjunction with the following figures, wherein like numerals denote like elements, and.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

In view of the limitations discussed in the foregoing section entitled "BACKGROUND," there exists an ongoing need to provide 3D packages and methods for producing 3D packages enabling side connect traces to be reliably formed on the sidewalls of one or more FO-WLP cores included within a 3D package. It would further be desirable if the 3D packages could be produced to include enlarged sidewall pads, which can be contacted by the side connect traces to form structurally-robust interfaces having relatively low electrical resistances. More generally, it would be desirable to provide microelectronic packages and methods for producing microelectronic packages, which achieve one or more of the aforementioned advantages regardless of whether the microelectronic package assumes the form of a 2D package containing a single FO-WLP core or a 3D package containing multiple stacked package cores. Other desirable features and characteristics of the present invention will become apparent from this Detailed Description and the appended Claims, taken in conjunction with the accompanying Drawings and the foregoing Background.

The following describes exemplary embodiments of microelectronic packages and methods for fabricating microelectronic packages wherein sidewall substrates are embedded within the molded bodies of FO-WLP cores. The microelectronic packages described herein can include a single FO-WLP core in certain embodiments, but are more usefully produced as 3D packages containing a first FO-WLP core stacked with at least a second package core, which may or may not be produced utilizing a FO-WLP approach. The FO-WLP core (or cores) can be produced to include a molded body in which one or more semiconductor die or other microelectronic devices are embedded. Sidewall substrates are further embedded in the fan-out or sidewall regions of the molded body, in an embodiment. The sidewall substrates have bodies that, when sawn or otherwise subject to singulation, provide a relatively planar sidewall surface that is substantially free of cavities or, at least, may have fewer cavities or reduced cavity depth as compared to the singulated surfaces of the molded body. Due to the reduced cavity topology of the sidewall substrates, side connect traces can be printed or otherwise formed on the sidewall substrates with a high degree of reliability to reduce the likelihood of discontinuities or other structural defects within the traces. In certain embodiments, the sidewall substrates are further produced to include electrically-conducive, embedded sidewall pads. The embedded sidewall pads can provide enlarged surface areas for contact with the side connect traces as compared to interconnect lines contained within one or more RDLs overlying the molded body. Due to their enlarged surface areas, the embedded sidewall pads can favorably decrease resistance across the pad-trace interfaces, while also enhancing the mechanical strength thereof.

Figure 1:
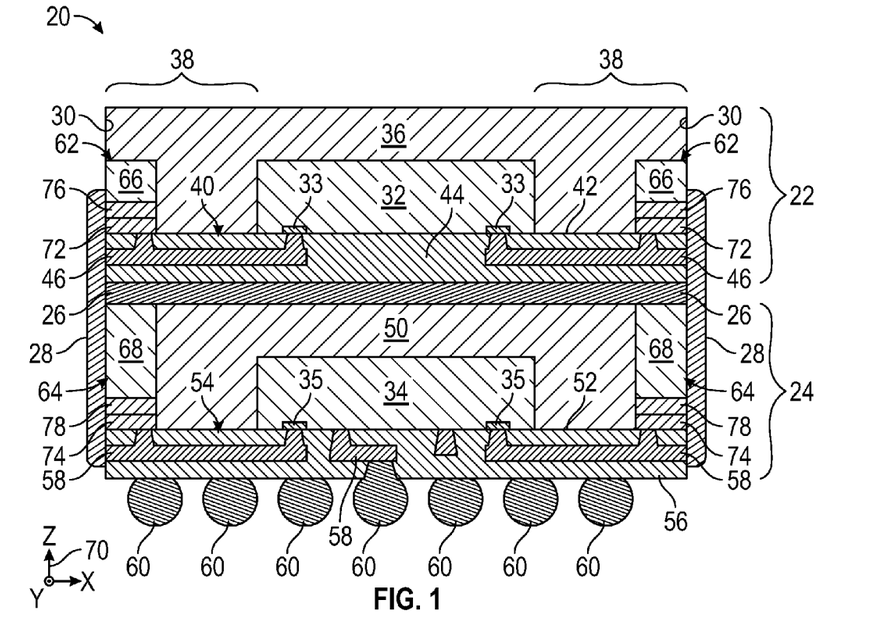
FIGS. 1 and 2 are cross-sectional and side views, respectively, of a 3D package including stacked FO-WLP cores in which sidewall substrates have been embedded, as illustrated in accordance with a first exemplary embodiment of the present invention.
Figure 2:
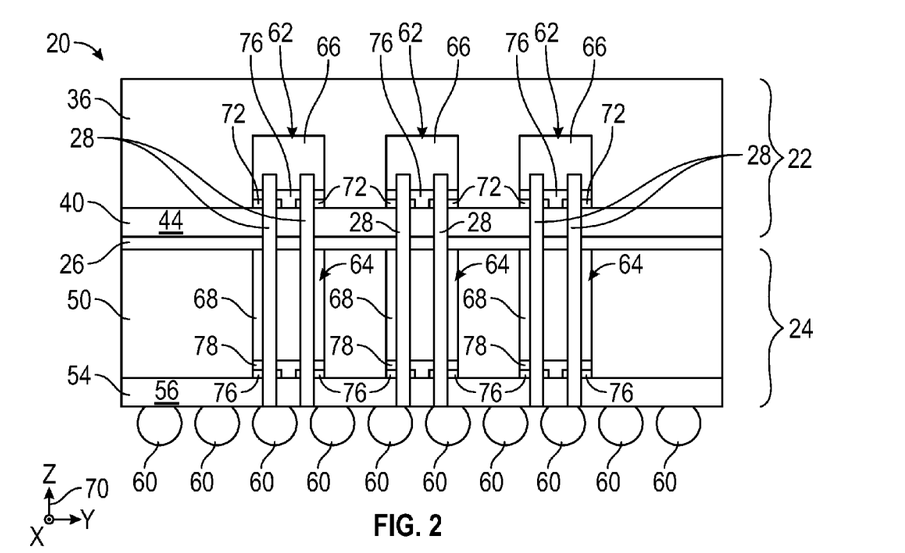

FIGS. 1 and 2 are cross-sectional and side views, respectively, of a 3D package 20, as illustrated in accordance with an exemplary embodiment of the present invention. 3D package 20 includes an upper package layer or core 22 and a lower package layer or core 24; the terms "upper" and "lower" utilized with reference to the illustrated orientation of 3D package 20 and with the understanding that package 20 can assume any orientation in three dimensional space. Package cores 22 and 24 are each produced utilizing a Fan Out-Wafer Level Packaging approach and are consequently referred to hereafter as "FO-WLP cores 22 and 24," respectively. FO-WLP cores 22 and 24 are positioned in a stacked relationship and joined by an intervening bonding layer 26, such as a layer of die attach material or double-sided adhesive tape. Upper and lower FO-WLP cores 22 and 24 each contain at least one microelectronic device embedded within a molded body or block of encapsulant. For example, as shown in FIG. 1, FO-WLP cores 22 and 24 can contain semiconductor die 32 and 34, respectively. A number of side connect traces 28 are formed over one or more sidewalls 30 of package 20 to interconnect FO-WLP cores 22 and 24 and, specifically, the microelectronic devices contained therein. Side connect traces 28 are described in more detail below. First, however, FO-WLP cores 22 and 24 are further discussed to provide an exemplary context in which 3D package 20 can be better understood.

Upper FO-WLP core 22 includes a molded body 36 having a fan-out region 38, which is adjacent to and extends around the perimeter of die 32. One or more RDLs 40 are formed over the lower principal surface 42 of molded body 36 (referred to herein as "build-up surface 42"). RDLs 40 include a dielectric body 44 containing electrically-conductive interconnect lines 46, which are electrically coupled to bond pads 33 of die 32. Dielectric body 44 can be composed of a number of dielectric layers deposited over build-up surface 42, and interconnect lines 46 can be plated metal (e.g., copper) traces interspersed with the dielectric layers. Lower FO-WLP core 24 likewise contains a molded body 50 in which semiconductor die 34 is embedded. Molded body 50 includes a fan-out region (not identified, but generally overlying fan-out region 38 of molded body 36) and a build-up surface 52 over which one or more RDLs 54 are formed. RDLs 54 include dielectric body 56 containing number of electrically-conductive interconnect lines 58. A BGA comprised of solder balls 60 is further produced over the frontside of RDLs 54 opposite molded body 50. Selected BGA solder balls 60 are electrically coupled to bond pads 35 of semiconductor die 34 via interconnect lines 58 to enable communication with packaged die 34 and with any other microelectronic components contained within lower FO-WLP core 24. Interconnection between bond pads 33 of die 32 and BGA solder balls 60 can also be provided through a combination of upper interconnect lines 46, side connect traces 28, lower interconnect lines 58, and the below-described sidewall pads 72 and 74, as appropriate, to complete the wiring structure of 3D package 20.

As shown in the accompanying figures and described herein, 3D package 20 is provided by way of non-limiting example only. In alternative embodiments, one of package cores 22 and 24 can be produced utilizing a different type of packaging approach, such as a Fan In-Wafer Level Packaging approach. Furthermore, while a particular package architecture is shown in FIGS. 1 and 2 for purposes of illustration, it will be appreciated that 3D package 20 can be produced to include other types of internal wiring structures and Input/Output (I/O) interfaces including various different combinations of contact arrays (e.g., BGAs, externally-exposed solder pads, stud bumps, Land Grid Arrays, etc.), RDLs, leadframes, interposers, wire bonds, TPVs, and so on. Moreover, 3D package 20 need not include an externally-accessible contact array in all embodiments and can instead communicate wirelessly utilizing, for example, a Radio Frequency (RF) antenna structure. In this latter case, 3D package 20 can be powered by an internal battery or by energy harvesting. Further, for each FO-WLP core 22, 24, although only one die 32, 34 and one layer of interconnect lines 46, 58 is shown in FIG. 1, alternate embodiments may include FO-WLP cores with multiple die and/or layers of interconnect lines.

At least one sidewall substrate is embedded in fan-out region 38 of upper FO-WLP core 22 and/or in the fan-out region of lower FO-WLP core 24. For example, as shown in FIGS. 1 and 2, a first plurality of sidewall substrates 62 can be embedded in fan-out region 38 of upper FO-WLP core 22, while a second plurality of sidewall substrates 64 is embedded in the fan-out region of lower FO-WLP core 24. Embedded sidewall substrates 62 and 64 include substrate bodies 66 and 68, respectively, which are formed from a material different than that utilized to produce FO-WLP molded bodies 36 and 50. Specifically, substrate bodies 66 and 68 are formed from a material that, when subject to the below-described panel singulation process, yields a surface that is likely to have a reduced cavity depth as compared to the singulated (e.g., sawn) surfaces of molded bodies 36 and 50. This is advantageous in that the singulated surfaces of molded bodies 36 and 50 can have irregular or non-planar topologies due to, for example, the formation of small craters or pockets created by the dislodgement of hard particles during panel singulation. Particle dislodgement is particularly problematic when panel singulation is carried-out by mechanical sawing, but can also occur when other singulation process are employed; e.g., when laser cutting is utilized, scattered laser energy can burn away resin surrounding the particles resulting in particle dislodgment.

The hard particles dislodged from the mold material can be, for example, relatively large filler (e.g., silica) particles contained within an epoxy-based mold compound utilized to produce molded bodies 36 and 50. The filler particles can have maximum diameters ranging from 50 to 80 microns (μm) (or more or less), and the sidewall craters can have depths approaching the maximum particle diameters. Without employing the sidewall substrates 62, 64 of the various embodiments, the sidewall craters created by hard particle dislodgement may otherwise disrupt the continuity of side connect traces 28, especially in instances wherein traces 28 are deposited to a thickness less than the maximum crater depth; e.g., in instances wherein trace thickness is less than 50 μm. Thus, by embedding sidewall substrates 62 and 64 in the respective fan-out regions of molded bodies 36 and 50, relatively smooth, planar sidewall surfaces can be provided on which traces 28 can be reliably formed. Any cavities present on the singulated surfaces of sidewall substrates 62 and 64 (that is, the externally-exposed surfaces of substrates 62 and 64 created during the below-described panel singulation process) preferably have a cavity depth less than 50 μm and, more preferably, less than 10 μm. A non-exhaustive list of materials from which substrate bodies 66 and 68 can be composed includes silicon (Si), gallium nitride (GaN), gallium arsenide (GaAs), ceramics, and resins. In one embodiment, substrate bodies 66 and 68 are produced by singulation of a wafer, such as a bulk silicon wafer, as described more fully below in conjunction with FIGS. 3-5.

Side connect traces 28 extend from points-of-contact provided on upper FO-WLP core 22 to corresponding points-of-contact provided on lower FO-WLP core 24. In certain embodiments, the points-of-contact can be provided on the backside of upper FO-WLP core 22 and/or the frontside of lower FO-WLP core 24 (corresponding to the upper and lower principal surfaces of 3D package 20, respectively, in the orientation shown in FIGS. 1 and 2). In such embodiments, side connect traces 28 can extend from package sidewalls 30 onto the frontside or backside of 3D package 20 to provide the desired interconnections between FO-WLP cores 22 and 24. However, in most cases, the points-of-contact interconnected by side connect traces 28 will be located on the sidewalls of FO-WLP cores 22 and 24 over which traces 28 extend. For example, as shown in FIGS. 1 and 2, certain interconnect lines 46 contained within RDLs 40 can extend to the sidewalls of FO-WLP core 22 to provide points-of-contact on upper FO-WLP core 22 enabling electrical interconnection with packaged die 32. Similarly, interconnect lines 58 contained within RDLs 54 can extend to the sidewalls of FO-WLP core 24 to define corresponding sidewall points-of-contact of lower FO-WLP core 24 enabling interconnection with packaged die 34. In this manner, side connect traces 28 can be formed on package sidewalls 30 and extend between corresponding pairs of laterally-exposed interconnect lines 46 and 58 to interconnect upper and lower FO-WLP cores 22 and 24 and, therefore, the microelectronic devices contained therein.

Side connect traces 28 can be produced from various different electrically-conductive materials, including plated metals and metal-filled epoxies or pastes. Side connect traces 28 may be produced by depositing the chosen electrically-conductive material or materials onto the package sidewalls 30. The electrically-conducive material can be deposited as an unpatterned layer, which is subsequently patterned utilizing a lithographical patterning process, by laser ablation, or by another process. Alternatively, the electrically-conductive material can be selectively deposited in a desired pattern such that side connect traces 28 are defined during initial deposition. In a preferred embodiment, side connect traces 28 are deposited onto package sidewalls 30 utilizing a three dimensional printing technique. Processes suitable for producing side connect traces 28 are discussed more fully below in conjunction with FIG. 11.

Any number of side connect traces 28 can be formed on one or more sidewalls 30 of 3D package 20 suitable for electrically interconnecting FO-WLP cores 22 and 24 and, specifically, the microelectronic components contained therein. In the illustrated embodiment, multiple side connect traces 28 are produced on each package sidewall 30 in a laterally-spaced row. As shown in FIGS. 1 and 2, side connect traces 28 can be produced to have elongated, straight geometries and extend substantially parallel to the package centerline (corresponding to the Z-axis identified by coordinate legend 70). In this case, corresponding pairs of sidewall substrates 62 and 64 may align or overlap vertically, as taken the Z-axis. In further embodiments, side connect traces 28 can be produced to have more complex geometries, such as L-, S-, or U-shaped geometries. Side connect traces 28 are deposited to a thickness between about 5 and about 10 μm in an embodiment. In further embodiments, side connect traces 28 can be thicker or thinner than the aforementioned range.

As indicated above, the maximum thickness and width of interconnect lines 46 and 58 can be restricted by the resolution requirements of 3D package 20. At package sidewalls 30, the surface area of the laterally-exposed regions of interconnect lines 46 and 58 can thus also be limited, which may result in relatively high electrical resistances and low mechanical strengths across the interconnect line-sidewall trace interfaces. In the case of exemplary 3D package 20, these limitations are overcome or at least mitigated by further including electrically-conductive sidewall pads 72 and 74 as part of sidewall substrates 62 and 64, respectively. As shown in FIGS. 1 and 2, sidewall pads 72 are formed over bodies 66 of sidewall substrates 62, while sidewall pads 74 are similarly formed over bodies 68 of sidewall substrates 64. Sidewall pads 72 and 74 are advantageously produced to have thicknesses and/or widths greater than the thicknesses and/or widths of interconnect lines 46 and 58 contained within RDLs 40 and 54. Imparting sidewall pads 72 and 74 with such enlarged dimensions (as compared to laterally-exposed interconnect lines 46 and 58) provides increased surface areas for contact with side connect traces 28. In this regard, the respective contact areas of sidewall pads 72 exposed through package sidewalls 30 are preferably greater than the cross-sectional areas of interconnect lines 46, which electrically couple pads 72 to bond pads 33 of die 32 (the cross-section taken along a cut plane orthogonal to the outer principal surface of RDLs 40). Similarly, the laterally-exposed contact areas of sidewall pads 74 are preferably greater than the cross-sectional areas of interconnect lines 58, which electrically couple pads 74 to bond pads 35 of die 34. By providing such an enlarged surface area for contact with side connect traces 28, electrical resistances across the trace-pad interfaces can be favorably decreased, while the mechanical strength thereof is enhanced (as compared to the interfaces between side connect traces 28, interconnect lines 46, and interconnect lines 58).

Sidewall pads 72 and 74 can comprise any electrically-conductive body exposed through package sidewalls 30 and suitable for electrically coupling side connect traces 28 to selected interconnect lines or other routing features contained within FO-WLP cores 22 and 24. In certain embodiments, sidewall pads 72 and 74 can assume the form of discrete pieces of metal, which are bonded to sidewall substrate bodies 66 and 68, respectively, during the below-described manufacturing process. However, in preferred embodiments, sidewall pads 72 and 74 are composed of a deposited electrically-conductive material, such as plated copper. In embodiments wherein bodies 66 and 68 of sidewall substrates 62 and 64 are composed of silicon or another electrically-conductive or semi-conductive material, one or more layers of dielectric material 76 and 78 can be formed between sidewall pads 72 and 74 and substrate bodies 66 and 68, respectively, to provide electrical isolation therebetween. The foregoing advantages notwithstanding, sidewall substrates 62 and 64 need not include sidewall pads 72 and 74 in all embodiments. For example, in certain embodiments, sidewall substrates 62 and 64 can be produced as non-layered blocks of materials consisting solely of substrate bodies 66 and 68. In still further embodiments, multiple patterned metal layers or levels can be produced over substrate bodies 66 and 68 for routing purposes in more complex embodiments of 3D package 20. Additionally, sidewall substrates 62 and 64 can form portions of active or passive devices embedded in the respective fan-out regions of molded bodies 36 and 50. In this latter case, sidewall substrates 62 and 64 can be the metal terminals of Surface Mount Device (SMDs) or other discrete components, which are positioned in the fan-out regions of molded bodies 36 and 50 such that the terminals are exposed at the sidewall surfaces of the 3D package after panel singulation to provide substantially planar, substantially cavity-free faces on which the side connect traces can be subsequently formed.

It will be appreciated that sidewall substrates 62 and 64 may only occupy those portions of 3D package 20 over which side connect traces 28 are formed. Furthermore, as shown most clearly in FIG. 2, multiple sidewall substrates 62 and 64 can be embedded into a single package sidewall 30. By embedding a row of multiple sidewalls substrates 62 and 64 in package sidewalls 30 in this manner, the cumulative surface area of the boundaries between substrates 62 and 64 and molded bodies 36 and 50 can be maximized to increase the bond strength between substrates 62 and 64 and molded bodies 36 and 50. This notwithstanding, the rows of sidewall substrates 62 and 64 can each be replaced by a single, laterally-elongated sidewall substrate in further embodiments. Additionally, a single sidewall substrate can be produced to have an L-, U-, or box-shaped geometry, which extends or wraps around multiple sidewalls of molded FO-WLP body 36 or molded FO-WLP body 50 in further implementations of 3D package 20.

By virtue of the above-described package architecture, side connect traces 28 can be formed on sidewalls 30 of 3D package 20 and, specifically, on embedded sidewall substrates 62 and 64 with a greater reliability than if package 20 were produced without substrates 62 and 64. Additionally, sidewall pads 72 and 74 provide increased surface areas contacted by side connect traces 28 to favorably reduce resistance across the side connect trace-sidewall pad interfaces, while increasing the mechanical strength thereof. As a still further advantage, fabrication of 3D package 20 can be performed largely or entirely on a panel level to enable a relatively large number of 3D packages to be produced in parallel. An exemplary embodiment of a manufacturing method suitable for producing 3D package 20 along with a number of other 3D packages will now be described in conjunction with FIGS. 3-11. As shown in FIGS. 3-11 and described further below, the fabrication method is offered by way of non-limiting example only. It is emphasized that the fabrication steps shown in FIGS. 3-11 can be performed in alternative orders, that certain steps may be omitted in alternative embodiments, and that additional steps may be performed in alternative embodiments. Additionally, description of structure and processes known within the microelectronic package industry may be limited or entirely omitted without providing the well-known process details.

Figure 3:
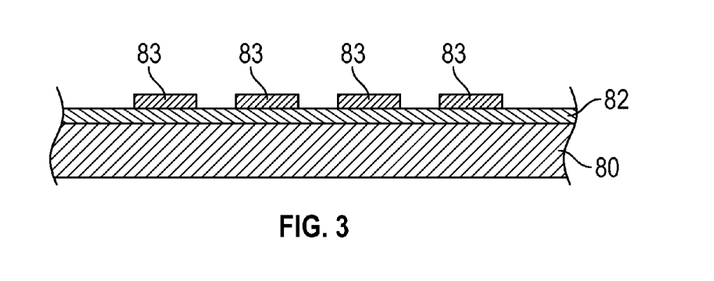
FIGS. 3-11 are cross-sectional views of the 3D package shown in FIGS. 1 and 2, as illustrated at various stages of completion and fabricated in accordance with an exemplary embodiment of the present invention.
Figure 4:
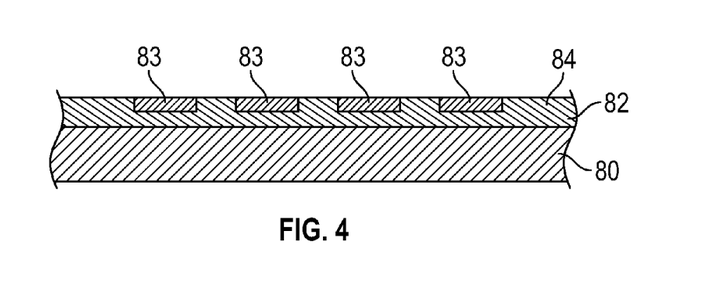
Figure 5:
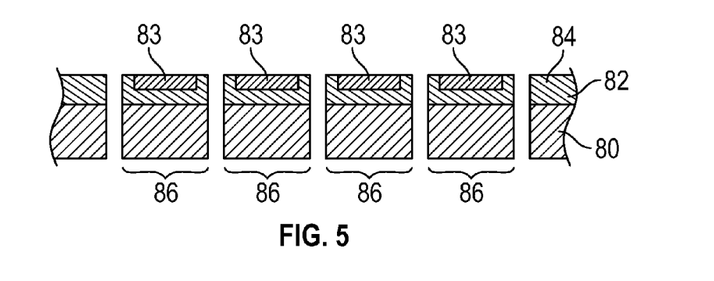

FO-WLP cores 22 and 24 can be produced utilizing similar processes. Thus, while focusing on the fabrication of lower FO-WLP core 24 to avoid redundancy, the following description is equally applicable to the fabrication of upper FO-WLP core 22. During fabrication of lower FO-WLP core 24, a number of sidewall substrate preforms or blocks are embedded in a molded panel and, when subject to sawing during singulation of the molded panel, yield sidewall substrates 64 shown in FIGS. 1 and 2. With reference to FIG. 3, the sidewall substrate blocks can be produced by processing a relatively large workpiece or wafer 80, such as a bulk silicon wafer (only a limited portion of which is shown in FIG. 3). A first dielectric layer 82 is deposited over the upper surface of wafer 80 by, for example, spin-on coating; and a number of metal features 83 are formed over dielectric layer 82 by, for example, plating and patterning one or more metal layers or levels. As shown in FIG. 4, a second dielectric layer 84 can further be deposited over patterned metal features 83 and the first dielectric layer 82; however, this is not necessary in all embodiments. Any dielectric overburden can then be removed by back grinding or chemical mechanical planarization ("CMP") such that metal features 83 are exposed through the upper surface of dielectric layer 82. The resulting structure is then singulated utilizing, for example, a dicing saw to yield a number of discrete sidewall substrate blocks 86, as generally shown in FIG. 5.

Figure 6:
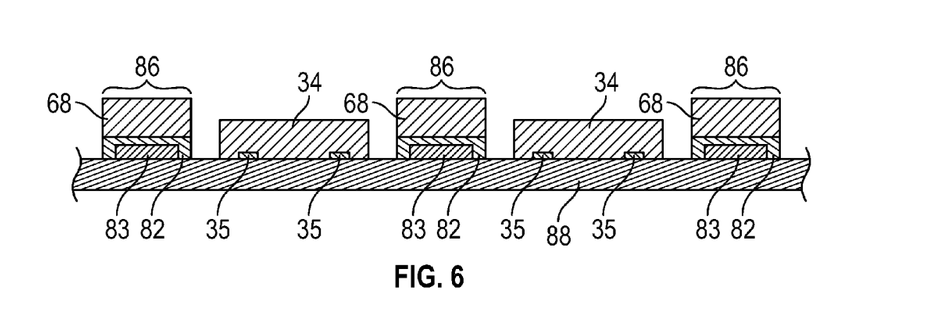
Figure 7:
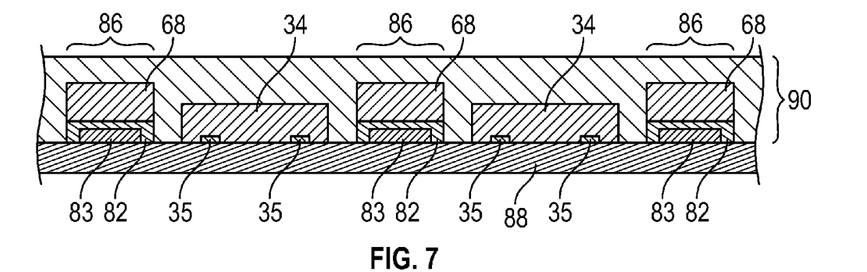

Panelization or overmolding is performed after production of sidewall substrate blocks 86. Panelization can commence with the placement of semiconductor die 34, substrate blocks 86, and perhaps other microelectronic devices on a temporary substrate. For example, as illustrated in FIG. 6, semiconductor die 34 can be inverted and placed face-down on a temporary substrate 88 using, for example, a pick-and-place tool such that bond pads 35 of die 34 contact the upper surface of substrate 88. Sidewall substrate blocks 86 are likewise placed face-down on substrate 88 in a predetermined grouping or side-by-side arrangement with die 34. Substrate blocks 86 are positioned at locations corresponding to the saw lanes or kerf areas of the molded panel produced pursuant to below-described panelization process. Such positioning ensures that blocks 86 are subject to sawing or another material removal process during panel singulation to provide a relatively smooth sidewall surface on which to form traces 28 (FIGS. 1 and 2) and to expose patterned metal features 83 through the package sidewall (thereby forming sidewall pads 74, as described below in conjunction with FIGS. 9 and 10). Only a relatively small portion of temporary substrate 88 supporting two semiconductor die 34 and three sidewall blocks 86 is shown in FIG. 6 to avoid unnecessarily cluttering the drawings. It will be appreciated, however, that temporary substrate 88 will typically be considerably larger than the illustrated portion, and that a relatively large number of semiconductor die 34 and substrate blocks 86 can be distributed across the upper surface of substrate 88 along with the illustrated die 34. Temporary substrate 88 can be a taped mold frame or any body, structure, or platform suitable for supporting substrate blocks 86, die 34 and the other non-illustrated substrate blocks and semiconductor die during the below-described encapsulation or panelization process.

An encapsulation or overmolding process is carried-out after placement of semiconductor die 34 and sidewall substrate blocks 86 in their desired positions. During the encapsulation, a non-illustrated mold frame having a central cavity or opening therein can be positioned over temporary substrate 88 and around semiconductor die 34, sidewall substrate blocks 86, and any other non-illustrated microelectronic components supported by substrate 88. An electrically-insulative encapsulant or mold compound, such as a silica-filled epoxy, is dispensed into the cavity of the mold frame. The encapsulant flows over and around semiconductor die 34 and sidewall substrate blocks 86. The encapsulant can then be solidified by thermal curing to yield a solid panel 90 in which semiconductor die 34 and sidewall substrate blocks 86 are embedded (shown in FIG. 7). Molded panel 90 is conveniently produced as a relatively thin, disc-shaped body or mass having a generally circular planform geometry; however, the panel body can be fabricated to have any desired shape and dimensions. In other embodiments, panel 90 can be produced utilizing various other known fabrication techniques including, for example, compression molding, dispense molding, and lamination processes.

Figure 8:
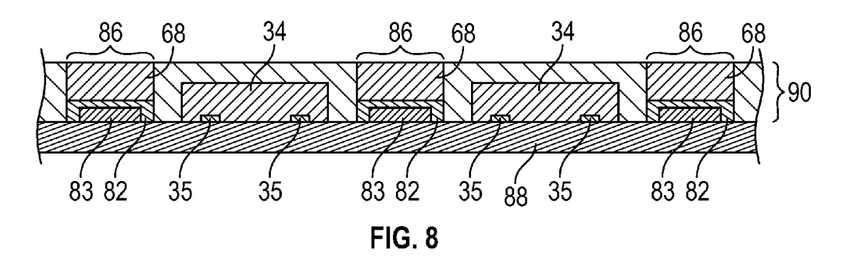

Molded panel 90 is next thinned to reveal embedded sidewall substrate blocks 86 through the panel backside. Panel thinning can be carried-out by back grinding, lapping, CMP, or another material removal process suitable for removing a predetermined thickness from molded panel 90 sufficient to expose bodies 68 of sidewall blocks 86 therethrough. The resultant structure is shown in FIG. 8. As can be seen, substrate blocks 86 now extend fully from the backside of newly-thinned molded panel 90 to the opposing frontside thereof. Pursuant to the below-described singulation process, each substrate block 86 is separated into two embedded sidewall substrates 64, while molded panel 90 is separated into a number of molded bodies 50 (shown in FIGS. 1 and 2). Backside thinning of molded panel 90 thus enables embedded sidewall substrates 64 to extend from the frontside to the opposing backside of molded body 50 for each lower FO-WLP core 24 produced by processing and singulation of panel 90. In instances wherein the sidewall substrates need not extend entirely from the frontside to the opposing backside of the molded body, it may be unnecessary to perform backside thinning of the panel. For example, the panel utilized to produce upper FO-WLP core 22 (FIGS. 1 and 2) may not be subject to backside thinning as embedded sidewall substrates 62 extend toward, but do not extend fully to the backside of molded body 36.

Figure 9:
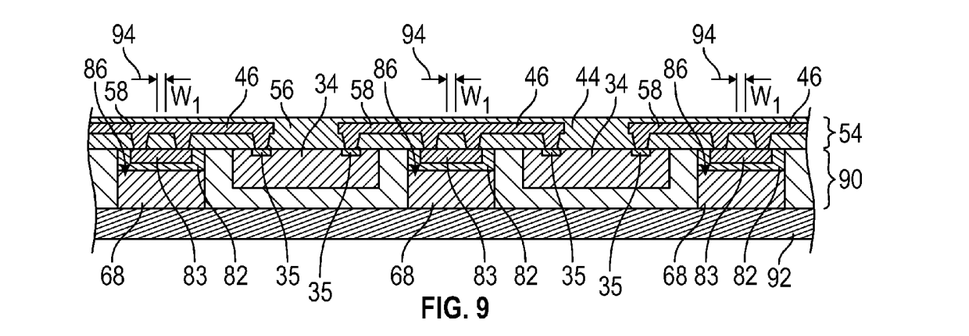

After backside thinning, molded panel 90 is thermally released or otherwise removed from temporary substrate 88 to reveal the frontside of panel 90. Bond pads 35 of semiconductor die 34 are exposed through the frontside of molded panel 90, as are metal features 83 of sidewall substrate blocks 86. Molded panel 90 is then inverted and attached to a support structure, such as a ceramic carrier 92 (shown in FIG. 9). With the frontside of molded panel 90 now facing upwards, RDLs 54 are sequentially built-up over the panel frontside. During RDL build-up, dielectric body 56 can be produced by spinning-on or otherwise depositing one or more dielectric layers over the frontside of panel 90. Interconnect lines 58 are interspersed with the deposited dielectric layers utilizing, for example, well-known lithographical patterning and conductive material deposition techniques. In one embodiment, interconnect lines 58 are produced by patterning a mask layer deposited over a seed layer, plating exposed regions of the seed layer with copper or another metal, and then removing the mask layer to define interconnect lines 58. As shown in FIG. 9, interconnect lines 58 are formed in contact with and, thus, electrically couple bond pads 35 of semiconductor die 34 to metal features 83 of sidewall substrate blocks 86.

Figure 10:
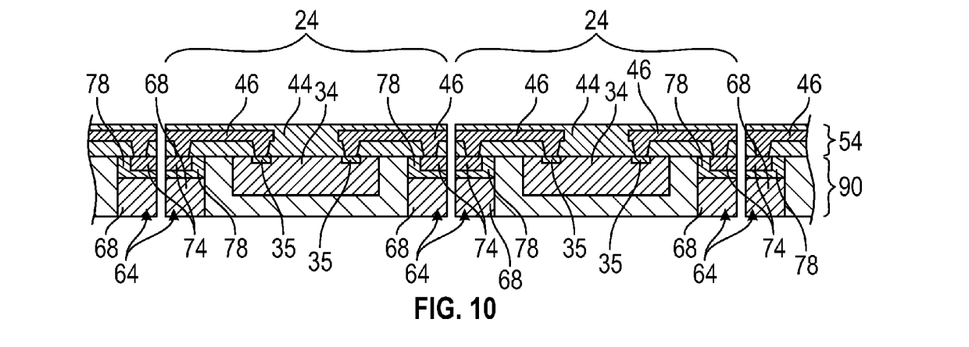

Advancing to FIG. 10, molded panel 90 is singulated to separate FO-WLP cores 24 into a number of individual cores. Singulation is conveniently carried-out utilizing a dicing saw; however, other singulation processes can also be utilized including, for example, laser cutting and water jetting. During singulation, molded panel 90 is sawn or otherwise separated along saw streets (represented in FIG. 9 by double-headed arrows 94). As may be appreciated by comparing FIG. 9 to FIG. 10, sidewall substrate blocks 86 (identified in FIG. 9) are placed in the kerf areas of molded panel 90 such that saw streets 94 pass through a middle portion blocks 86. The saw streets have a width $W_1$ (also identified in FIG. 9), which is less than the widths of substrate blocks 86. During sawing, each substrate block 86 is bisected or split to yield two sidewall substrates 64, each of which is embedded in the fan-out region of a different FO-WLP core 24. Singulation also separates patterned metal features 83 into two portions, each defining an embedded sidewall pad 74 (identified in FIG. 10). In an alternate embodiment, each substrate block 86 may extend into, but only partially across a saw street such that a portion of each substrate block 86 is removed during sawing, but not bisected to yield two sidewall substrates.

Figure 11:
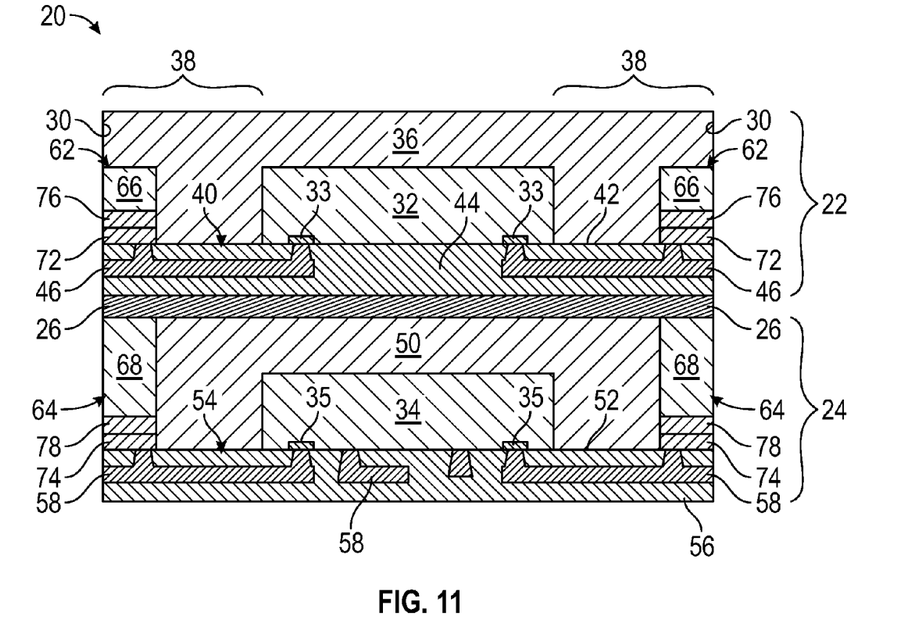

Either prior to or after singulation of molded panel 90, each lower FO-WLP core 24 is bonded to its corresponding upper FO-WLP core 22 in a stacked relationship. In preferred embodiments, molded panel 90 containing FO-WLP cores 24 is stacked with a second molded panel (not shown) containing FO-WLP cores 22 and the resulting panel stack is then singulated to yield a number of partially-completed 3D packages 20. The resultant structure is shown in FIG. 11. Although not shown in FIG. 11, BGA solder balls 60 (FIGS. 1 and 2) can also be formed over RDLs 54 prior to singulation of molded panel 90.

Side connect traces 28 are next formed on opposing package sidewalls 30 to interconnect FO-WLP cores 22 and 24 and thereby complete the production of 3D package 20. Side connect traces 28 can be produced utilizing a number of different deposition processes. In one embodiment, a printing technique is utilized allowing the selective deposition of an electrically-conductive ink in a predetermined pattern or design. A non-exhaustive list of suitable printing techniques includes inkjet printing, aerosol printing, screen printing, and needle dispensing techniques. Suitable electrically-conductive inks include, but are not limited to, inks containing relatively small metal particles, such as gold or silver particles in the nanometer range (e.g., particles having average diameters ranging from about 2 to about 50 nanometers). Thermal or ultraviolet curing can be performed after printing of the electrically-conductive ink traces, as appropriate. In further embodiments, an electrically-conductive layer, such as an electrically-conductive paste or metal layer, can be deposited over package sidewalls 30 and then patterned by lithographical patterning, laser ablation, or another patterning process.

The foregoing has thus provided a microelectronic package including at least one FO-WLP core in which sidewall substrates are embedded. The sidewall substrates have bodies that, when sawn or otherwise subject to singulation, may provide relatively planar surfaces having fewer or less pronounced topological irregularities (cavities or pockets) as compared to the singulated surfaces of the molded body. This, in turn, allows side connect traces to be printed or otherwise formed on the singulated surfaces of the sidewall substrates with a high degree of reliability. In certain embodiments, the sidewall substrates are further produced to include sidewall pads, which provide enlarged surface areas for contact with the side connect traces as compared to, for example, interconnect lines contained within one or more RDLs overlying the molded body. Due to their enlarged surface areas, the sidewall pads can favorably decrease resistance across the sidewall pad-side connect trace interfaces, while also enhancing the mechanical strength thereof. In the above-described exemplary embodiment, the embedded sidewall substrates were produced by processing and singulation of a wafer. However, in further embodiments, a relatively large frame or structure can be embedded in a molded panel, which connects or ties together a number of sidewall substrates included within the various FO-WLP cores produced by processing of the molded panel. In this latter case, the sidewall substrates can be separated into individual pieces during the panel singulation process utilized to divide the molded panel into a number of discrete FO-WLP cores.

Figure 12:
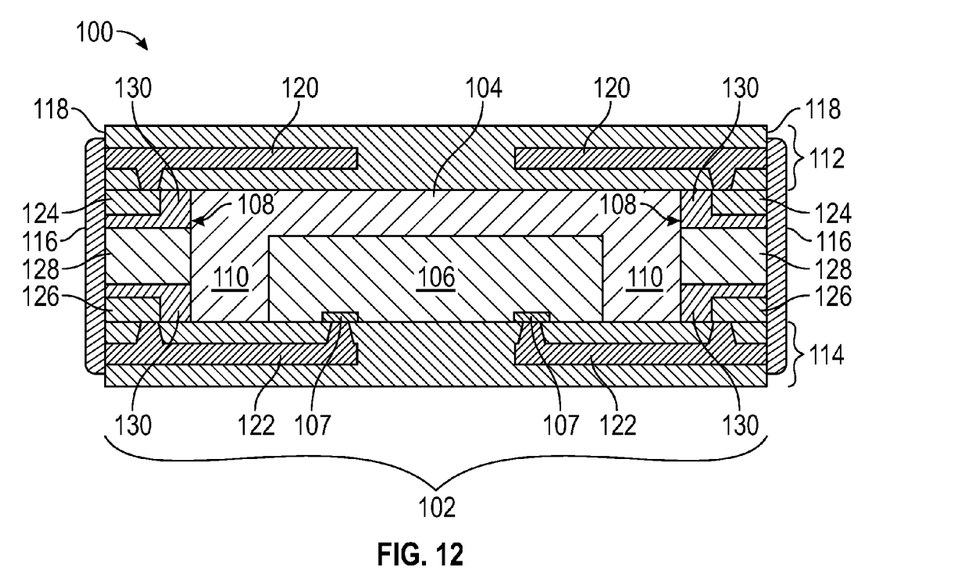
FIG. 12 is a cross-sectional view of a 3D package including a single FO-WLP core in which sidewall substrates have been embedded, as illustrated in accordance with a further exemplary embodiment of the present invention.

In the above-described exemplary embodiment, the microelectronic package is a 3D package having two FO-WLP cores bonded in a stacked relationship. However, in further embodiments, the microelectronic package can be a 2D package containing a single FO-WLP core. Further emphasizing this point, FIG. 12 is a cross-sectional view of a microelectronic package 100 containing a single FO-WLP core 102, as illustrated in accordance with a further exemplary embodiment of the present invention. As do FO-WLP cores 22 and 24 of 3D package 20 (FIGS. 1-11), FO-WLP core 102 includes a molded body 104 in which a semiconductor die 106 and a number of sidewall substrates 108 are embedded. More specifically, die 106 is embedded in a central region of molded body 104, while sidewall substrates 108 are embedded in the surrounding fan-out region 110 of body 104. In this example, package 100 is double-sided and includes both backside and frontside RDLs 112 and 114, respectively. Backside interconnect lines 120 are formed in RDLs 112 and extend to package sidewalls 118, while frontside interconnect lines 122 are formed in frontside RDLs 114 and likewise extend to package sidewalls 118. Side connect traces 116 are formed over opposing sidewalls 118 of microelectronic package 100 and in contact with sidewall substrates 108 exposed therethrough. Side connect traces 116 electrically couple corresponding pairs or groups of interconnect lines 120 and 122 to provide electrically conductive paths between backside and frontside RDLs 112 and 114. As was the case previously, sidewall substrates 108 can be produced to include one or more enlarged sidewall pads 124 and 126. For example, as shown in FIG. 12, sidewall pads 124 and 126 can be formed over opposing surfaces of the bodies 128 of substrates 108. In embodiments wherein the substrate bodies 128 are electrically-conducive, intervening dielectric layers 130 can be formed between sidewall pads 124 and 126 and bodies 128, as appropriate. Sidewall pads 124 and 126, which are electrically connected to interconnect lines 120, 124, respectively, thus provide an increased surface area in ohmic contact with side connect traces 116 to lower the electrical resistance and enhance mechanical strength across the trace-pad interfaces, as previously described.

There have thus been described multiple exemplary embodiments of microelectronic packages and methods for fabricating microelectronic packages wherein sidewall substrates are embedded within the molded bodies of FO-WLP cores. Sidewall substrates are embedded in sidewall or fan-out regions of the molded bodies and, when sawn or otherwise subject to singulation, provide a relatively planar surface topology that may have a reduced roughness as compared to the sawn regions of the molded body. This, in turn, allows side connect traces to be printed or otherwise formed on the sidewall substrates with an increased reliability and a reduced likelihood of incomplete connection. Additionally, in certain embodiments, the FO-WLP cores are further produced to contain enlarged sidewall pads, which are electrically connected to the side connect traces to decrease resistance across the pad-trace interface, while also increasing the mechanical strength thereof. In such embodiments case, the sidewall pads may be considered "enlarged" as compared to the cross-sectional dimensional of interconnect lines contained within one or more RDLs formed over the molded body, as taken along a cut plane orthogonal to the upper principal surface of the RDLs. As a still further advantage, fabrication of the microelectronic packages described herein can be performed on a panel level, at least in substantial part, to improve manufacturing efficiency and throughput.

In the above-described exemplary embodiments, the sidewall substrates assume the form of or included passive blocks of material that yield relatively planar and generally cavity-free surface topologies when subject to panel singulation. In further embodiments, the sidewall substrates can assume other forms and can be included in larger structures or more complex components providing that: (i) the substrates are subject to material removal during the panel singulation process, and (ii) the singulated surfaces of the substrate are exposed at the package sidewalls and are likely to have fewer cavities or decreased cavity depths as compared to the singulated surfaces of the molded material. For example, and as briefly noted above, the sidewall substrates can assume the form of the end terminals of one or more SMDs in certain embodiments. The SMDs can be, for example, discrete inductors, resistors, capacitors, or diodes, which are positioned to extend into the kerf area of the molded panel from which the FO-WLPs are produced. During panel singulation, a small amount of material is removed from the SMD terminals to yield relatively smooth, cavity-free surfaces, which are exposed at the package sidewall and on which the side connect traces can be printed or otherwise formed. In still further embodiments, the sidewall substrate can be a discrete sub-package, such as a flat no-lead package, which is embedded in the panel and extends to the kerf area thereof. If desired, the sub-package can be placed on its edge such that the active or frontside of the package faces the kerf area. Pursuant to panel singulation, the embedded sub-package yields a sidewall-exposed, relatively cavity-free surface over which one or more side connect traces can be formed. In such implementations, the side connect traces can be formed in contact with the terminals of the embedded sub-package to provide additional functionality to the larger 2D or 3D package.

In one embodiment, the microelectronic package fabrication method includes producing a molded panel containing a sidewall substrate. The molded panel is singulated to produce a FO-WLP core including a molded body having a fan-out region in which the sidewall substrate is embedded. A side connect trace is printed or otherwise formed on a sidewall of the FO-WLP core and extends at least partially across the embedded sidewall substrate. In a second embodiment, the method includes producing a FO-WLP core including a first molded body, a sidewall substrate exposed through a sidewall of the first molded body, and a first sidewall pad exposed through the sidewall of the first molded body. The first FO-WLP core is stacked with a second FO-WLP core having a second molded body and a second sidewall pad exposed therethrough. A side connect trace is formed extending from the first sidewall pad, over the sidewall substrate, and to the second sidewall pad to interconnect the first and second FO-WLP cores. The foregoing has also provided embodiments of a microelectronic package, such as a 3D package. In one embodiment, the microelectronic package includes a first FO-WLP core and at least one side connect trace. The FO-WLP core includes, in turn, a molded body having a fan-out region, a microelectronic device embedded in the molded body and surrounded by the fan-out region, and a sidewall substrate embedded in the fan-out region of the molded body. The side connect trace is electrically coupled to the microelectronic device and formed at least partially on the embedded sidewall substrate.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It should be understood that various changes can be made in the function and arrangement of elements described in an exemplary embodiment without departing from the scope of the invention as set-forth in the appended claims.

As appearing in the foregoing Detailed Description, terms such as "comprise," "include," "have," and the like are intended to cover non-exclusive inclusions, such that a process, method, article, or apparatus that comprises a list of elements is not necessarily limited to those elements, but can include other elements not expressly listed or inherent to such process, method, article, or apparatus. As still further appearing herein, terms such as "over," "under," "on," and the like are utilized to indicate relative position between two structural elements or layers and not necessarily to denote physical contact between structural elements or layers. Thus, a first structure or layer can be described as fabricated "over" or "on" a second structure, layer, or substrate without indicating that the first structure or layer necessarily contacts the second structure, layer, or substrate due to, for example, presence of one or more intervening layers. As appearing further herein, the term "microelectronic component" is utilized in a broad sense to refer to an electronic device, element, or structure produced on a relatively small scale and amenable to packaging in the above-described manner. Microelectronic components include, but are not limited to, integrated circuits formed on semiconductor die, Microelectromechanical Systems (MEMS) devices, passive electronic components, optical devices, and other small scale electronic devices capable of providing processing, memory, sensing, radiofrequency, optical, and actuator functionalities, to list but a few examples. Microelectronic components also include other discrete or separately-fabricated structures that can be integrated into the FO-WLP, such as prefabricated via structures and prefabricated antenna structures.

What is claimed is:

1. A microelectronic package, comprising:
  a first Fan-Out Wafer Level Package (FO-WLP) core, comprising:
    a first molded body having a fan-out region and a sidewall;
    a sidewall substrate embedded in the fan-out region of the first molded body; and
    a first sidewall pad exposed through the sidewall of the first molded body;
  a second FO-WLP core in a stacked relationship with the first FO-WLP core, the second FO-WLP core comprising:
    a second molded body having a sidewall; and
    a second sidewall pad exposed through the sidewall of the second molded body; and
  a first side connect trace extending from the first sidewall pad, over the sidewall substrate, and to the second sidewall pad to electrically interconnect the first and second FO-WLP cores;
  wherein the sidewall substrate comprises a substrate body, wherein the first FO-WLP core further comprises a dielectric layer between the first sidewall pad and the substrate body, and wherein the first sidewall pad is at least partially composed of a metal plated over the dielectric layer.

2. The microelectronic package of claim 1, wherein the substrate body is composed at least partially of a resin, a ceramic, silicon, gallium nitride, or gallium arsenide.

3. The microelectronic package of claim 1, further comprising multiple side connect traces in which the first side connect trace is included, the multiple side connect traces arranged in a laterally-spaced row contacting the sidewall substrate.

4. The microelectronic package of claim 1, wherein the first side connect trace has a substantially straight geometry and extends substantially parallel to a centerline of the microelectronic package.

5. The microelectronic package of claim 1, wherein the first FO-WLP core further comprises one or more Redistribution Layers (RDLs) formed over the first molded body, the one or more RDLs containing an interconnect line electrically coupled to the first sidewall pad.

6. The microelectronic package of claim 5, wherein the first sidewall pad has a surface area exposed through the sidewall of the first molded body, and wherein the surface area of the first sidewall pad is greater than a cross-sectional area of the interconnect line, as taken along a cut plane orthogonal to an upper principal surface of the one or more RDLs.

7. The microelectronic package of claim 1, wherein the first molded body and the sidewall substrate each comprise a singulated surface, and wherein the singulated surface of the sidewall substrate has a surface roughness less than the singulated surface of the first molded body.

8. A microelectronic package, comprising:
  a first Fan-Out Wafer Level Package (FO-WLP) core, comprising:
    a first molded body having a fan-out region and a sidewall;
    a sidewall substrate embedded in the fan-out region of the first molded body; and
    a first sidewall pad exposed through the sidewall of the first molded body;
  a second FO-WLP core in a stacked relationship with the first FO-WLP core, the second FO-WLP core comprising:

a second molded body having a sidewall; and
a second sidewall pad exposed through the sidewall of the second molded body; and
a first side connect trace extending from the first sidewall pad, over the sidewall substrate, and to the second sidewall pad to electrically interconnect the first and second FO-WLP cores;
wherein the sidewall substrate contains a substrate body comprised of a singulated piece of a bulk silicon wafer.

9. The microelectronic package of claim 8, further comprising multiple side connect traces in which the first side connect trace is included, the multiple side connect traces arranged in a laterally-spaced row contacting the sidewall substrate.

10. The microelectronic package of claim 8, wherein the first side connect trace has a substantially straight geometry and extends substantially parallel to a centerline of the microelectronic package.

11. The microelectronic package of claim 8, further comprising one or more Redistribution Layers (RDLs) formed over the first molded body, the one or more RDLs containing an interconnect line electrically coupled to the first sidewall pad.

12. The microelectronic package of claim 11, wherein the first sidewall pad has a surface area exposed through the sidewall of the first molded body, and wherein the surface area of the first sidewall pad is greater than a cross-sectional area of the interconnect line, as taken along a cut plane orthogonal to an upper principal surface of the one or more RDLs.

13. The microelectronic package of claim 8, wherein, the first molded body and the sidewall substrate each comprise a singulated surface, and wherein the singulated surface of the sidewall substrate has a surface roughness less than the singulated surface of the first molded body.

14. A microelectronic package, comprising:
a first Fan-Out Wafer Level Package (FO-WLP) core, comprising:
a molded body having a fan-out region;
a microelectronic component embedded in the molded body adjacent the fan-out region;
an embedded sidewall substrate located in the fan-out region of the molded body, the embedded sidewall substrate comprising a substrate body; a dielectric layer formed over the substrate body; and a first sidewall pad exposed through a sidewall of the molded boy and at least partially composed of a metal plated over the dielectric layer; and
a side connect trace electrically coupled to the microelectronic component and formed at least partially on the embedded sidewall substrate.

15. The microelectronic package of claim 14, further comprising a second FO-WLP core bonded to the first FO-WLP core in a stacked relationship, the first FO-WLP core and the second FO-WLP core electrically interconnected by the side connect trace.

16. The microelectronic package of claim 15, wherein the first FO-WLP core has a frontside and an opposing backside, wherein the opposing backside of the first FO-WLP core is bonded to the second FO-WLP core, and wherein the embedded sidewall substrate extends from the frontside to the opposing backside of the first FO-WLP core.

17. The microelectronic package of claim 14, further comprising a second FO-WLP core bonded to the first FO-WLP core in a stacked configuration;
wherein the second FO-WLP core comprises second sidewall pad; and
wherein the side connect trace extends from the first sidewall pad to the second sidewall pad to electrically interconnect the first and second FO-WLP cores.

18. The microelectronic package of claim 14, wherein the embedded sidewall substrate comprises a sidewall pad, and wherein the side connect trace is electrically coupled to the microelectronic component through the sidewall pad.

19. The microelectronic package of claim 18, further comprising one or more Redistribution Layers (RDLs) formed over the molded body and containing an interconnect line, the interconnect line electrically coupling the microelectronic component to the sidewall pad.

* * * * *